United States Patent
Karlsson et al.

[11] Patent Number: 5,986,798
[45] Date of Patent: Nov. 16, 1999

[54] METHOD AND ARRANGEMENT FOR POLING OF OPTICAL CRYSTALS

[75] Inventors: Håkan Karlsson; Gunnar Arvidsson, both of Stockholm; Peter Henriksson, Enskede; Fredrik Laurell, Danderyd, all of Sweden

[73] Assignee: Aktiebolaget IOF Institutet for optisk forskning, Stockholm, Sweden

[21] Appl. No.: 09/113,835

[22] Filed: Jul. 10, 1998

Related U.S. Application Data

[63] Continuation of application No. PCT/SE97/00026, Jan. 10, 1997.

[51] Int. Cl.[6] ........................................... G02F 1/35
[52] U.S. Cl. ................................................. 359/326
[58] Field of Search ........................... 359/326–332; 385/122

[56] References Cited

U.S. PATENT DOCUMENTS

| | | | |
|---|---|---|---|
| 5,157,754 | 10/1992 | Bierlein et al. | 385/122 |
| 5,193,023 | 3/1993 | Yamada et al. | 359/245 |
| 5,521,750 | 5/1996 | Onoe et al. | 359/332 |
| 5,568,308 | 10/1996 | Harada | 359/326 |
| 5,615,041 | 3/1997 | Field et al. | 359/326 |
| 5,652,674 | 7/1997 | Mizuuchi et al. | 359/326 |
| 5,748,361 | 5/1998 | Gupta et al. | 359/332 |
| 5,756,263 | 5/1998 | Gupta et al. | 385/122 X |
| 5,875,053 | 2/1999 | Webjorn et al. | 359/326 |
| 5,879,590 | 3/1999 | Blom et al. | 359/326 X |

FOREIGN PATENT DOCUMENTS

0687941A2  12/1995  European Pat. Off. .

*Primary Examiner*—John D. Lee
*Attorney, Agent, or Firm*—Jones, Day, Reavis & Pogue

[57] ABSTRACT

The present invention relates to a method for the periodic domain inversion of ferroelectric flux-grown crystals that are low conductive or made low conductive. The invention also relates to an arrangement for monitoring the domain inversion of crystals while using a laser. The invention also relates to the use of crystals in applications of periodic domain inverted crystals, partly for generating light (electromagnetic radiation) at new wavelengths by non-linear optical frequency mixing (frequency doubling, difference frequency generation, summation frequency generation, optical parametric oscillation, etc.) and partly for electro-optical applications, such as light beam modulation, and partly for acoustic applications. such as the generation of acoustic waves from electric voltages applied across the crystal.

20 Claims, 2 Drawing Sheets

METHOD AND ARRANGEMENT FOR POLING OF OPTICAL CRYSTALS

This is a continuation of copending International Application PCT/SE97/00026 filed on Jan. 10, 1997 and which designated the U.S.

FIELD OF INVENTION

The present invention relates to a method of preparing flux-grown crystals prior to achieving poling, and an arrangement for monitoring periodic poling of ferroelectric crystals by using the electro-optical effect of the crystal, and to the use of poled crystals as hereinafter described. The invention relates in particular to applications of periodically poled crystals partly to generate light or other electromagnetic radiation at new wavelengths by non-linear optical frequency-mixing (frequency doubling, frequency difference generation, frequency summation generation, optical parametric oscillation, and so on), partly for electro-optical applications such as light beam modulation, and partly for acoustic applications such as the generation of acoustic waves from electric voltages applied across the crystal

BACKGROUND OF THE INVENTION

Periodically poled crystals of non-linear optical, electro-optical and acousto-optical crystals, such as potassium titanyl phosphate (KTiOPO4) designated as KTP and other crystals within the same crystal family, such as the isomorphs KTA known as potassium titanyl arsenide, RTA known as rubidium titanyl arsenide, CTA known as cesium titanyl arsenide, RTP known as rubidium titanyl phosphate, and others are preferably grown by the so-called flux method.

Periodically poled crystals have been used mainly for non-linear optical frequency mixing, and in particular to generate light at new wavelengths on the basis of light at available laser wavelengths. There is at present a desire for novel radiation sources based on this principle. However, periodically poled crystals can also be used in electro-optical applications and acoustic applications. One example of an acoustic optical application is that a Bragg lattice that has a periodically varying diffraction index will occur in a periodically poled crystal in response to a voltage applied across the crystal through the medium of homogenous electrodes. This application can be utilized to modulate or deflect a laser beam, for instance. The poled crystals can also be used as so-called acoustic transducers, i.e. used to generate or to detect an acoustic wave with the aid of the piezoelectric effect. These physical phenomena and applications are well known in themselves, although the periodically poled crystals afford significant advantages and greater possibilities with respect to design of well-functioning components in comparison with standard crystals.

The quasi phase matching, periodically poled crystals relevant in the present context are based on the principle of producing in an existing crystal periodically ordered regions of alternating crystal orientation and therewith periodically varying non-linear optical, electrooptical and acousto-optical properties. This is preferably achieved by applying an electric voltage across the crystal with the aid of a periodic electrode structure, and is thus effected without disintegrating the crystal mechanically.

The published European Patent Application 0 687 941 A2 teaches the formation of inverted or pole reversed ferroelectric domain regions, by applying a ramp voltage across a substrate or crystal, among other things, wherein it has been observed that it is possible to predict an increase in the flow of current through the substrate. Poling can then be considered to have taken place and the voltage is switched-off when the anticipated or predicted current flow has been detected.

SUMMARY OF TUE INVENTION

The object of the present invention is to enable periodically poled crystals to be produced from non-periodically poled flux-grown crystals, so-called single domain crystals.

Another object of the invention is to provide a method of monitoring such fabrication. Yet another object of the invention is to point our applications or usages of periodically poled crystals for generating light (electromagnetic radiation) at new wavelengths by nonlinear optical frequency mixing (frequency doubling, difference frequency generation, summation frequency generation, optical parametric oscillation, and so on).

The present invention is also used for electro-optical applications, such as light beam modulation, and for acoustic applications, such as the generation of acoustic waves from electric voltages applied across the crystal.

With the intention of achieving these objects and aims, the present invention provides a method for the periodic domain inversion of ferroelectric flux-grown crystals such as KTP, KTA, RTP, RTA or CTA, wherein the flux-grown crystals either have a low conductivity inherently or are or made lowly conductive prior to effecting domain inversion with domain inversion means.

In one embodiment of the invention, the crystals are doped, such that the dopant or dopants lowers/lower the conductivity of the crystal. The dopant or dopants may be one or more of the dopants Ga, Sc, Cr and Rb.

In an alternative embodiment of the present invention domain inversion is effected with the aid of an ion exchange process, wherein a layer that has low ionic conductivity is generated on the surfaces of the crystal, and wherein the major part of an applied voltage, via a voltage divider, lies across said layer and creates one or more domains that grow through the entire crystal under the influence of the electric field.

Domain inversion can be achieved in both embodiments with the aid of periodic electrodes applied on one side of the crystal. The electrodes will preferably be liquid electrodes or metal electrodes, wherein the insulation between the so-called fingers of the electrodes may be air, some other gas, a liquid, glass, a polymer or a vacuum.

According to an alternative embodiment, the ion exchange is carried out solely on one side of the crystal.

In a further embodiment, the ion exchange is effected periodically so as to obtain a crystal having spatially varying conductivity, wherein domain inversion is effected solely in the generated region of low conductivity.

Alternatively, the ion exchange may be effected across the entire surface of the crystal, so as to lower conductivity, and a second ion exchange is effected so as to restore a periodically high conductivity, wherein domain inversion is effected by applying electric pulses that have a voltage such that solely the domains of the regions of low conductivity are reversed.

The ion exchange is preferably effected with one or more of the ions Rb, Ba, Na, Cs, Tl, H, Li, Ca or Sr.

In one embodiment, the ion exchange is effected with the aid of nitrate salts, for instance.

In another embodiment, electro-optic methods are used for actively monitoring domain reversal. The objects and aims of the present invention are also achieved with the aid of an arrangement for monitoring the periodic domain inversion of ferroelectric crystals while using the electro-optic effect of the crystals, wherein the arrangement includes light generating means and the light generated is caused to propagate through the crystal at right angles to the z-axis thereof.

The arrangement also includes means for applying an electric field across two poles of the crystal in the z-direction, wherein one pole has a periodic electrode structure that enables phase shifting between different polarization directions of light that propagates at right angles to said z-axis.

The phase shift between the z-component of the light and any one of its remaining components changes the polarization state of the light by virtue of the electro-optic coefficients of the crystal and the applied electric field, wherein domain inversion is achieved and determined by observing changes that are caused by the voltage pulse generating means via the electric field and the resultant phase shift in an optical manner via means for receiving the phase-shifted light.

The light is preferably laser generated.

In one embodiment of the arrangement, the means used to receive phase-shifted light is a photodiode that measures the intensity of the light received, whereafter the diode output signal is analyzed by a measuring instrument and compared with the applied voltage pulse, wherein domain inversion is determined by comparing the shape of the intensity curve from pulse to pulse with the use of short voltage pulses, and wherein changes in the voltage pulses determine the optimal time at which domain inversion shall be stopped.

In another embodiment of the arrangement, the crystal that phase-shifts the light and the means for receiving phase-shifted light are included in an interferometer, wherein domain inversion is stopped when the interference rings generated by the interferometer change direction.

The present invention also includes the use of afore-described prepared domain reversed ferroelectric flux-grown crystals of the type KTP, KTA, RTP, RTA or CTA for the frequency conversion of coherent light, other appropriate electromagnetic radiation, electro-optical modulation or for acoustic applications, wherein the flux-grown crystals either have an inherent low conductivity or are made low conductive prior to effecting domain inversion with domain inversion means.

Defining of low conductive isomorphs, alternatively preparing high conductive isomorphs in accordance with the aforegoing for the purpose of lowering conductivity, preferably together with electro-optic active monitoring of the domain reversal, is necessary to enable crystals of the KTP family to be poled periodically by means of the inventive method and arrangement and also by other poling methods and arrangements. Satisfactory poling has not been possible with known methods and arrangements.

BRIEF DESCRIPTION OF THE DRAWINGS

So that the invention will be more readily understood and further embodiments thereof made apparent, the invention will now be described with reference to the accompanying drawings, in which.

DETAILED DESCRIPTION OF PREFERRED EMBODIMENTS

Figure 1:
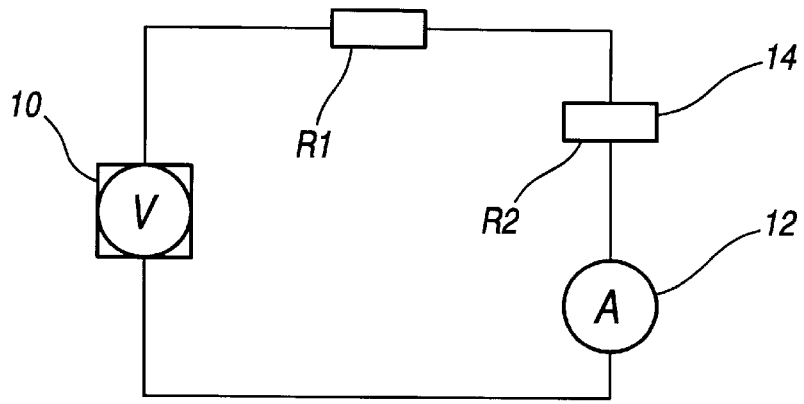
FIG. 1 illustrates diagrammatically how the conductive contribution and poling contribution can be separated for a very low conductive crystal, by measuring the current that enters a crystal when a voltage pulse is applied.

The present invention relates to a method and to an arrangement for periodically poling $KTiOPO_4$ crystals and other crystals from the same family grown by the flux method among other things, and to its field of use.

$KTiOPO_4$ (KTP) is a crystal that has very good optical non-linear properties. The crystal is used as a standard in frequency-doubled laser systems and for optical parametric oscillators. KTP belongs to an isomorph crystal family $MTiOXO_4$, where M={K, Rb, Ti or Cs} and X={P or As (solely for M=Cs)}. Each of these crystals has a slightly different property from the others, such as optical non-linearity, optical transmission range, conductivity, etc. These different properties enhance flexibility in the manufacture and optimization of laser systems.

An important factor within the non-linear optic is the development of the so-called quasi phase matching technology (QPM). In this technology, non-linearity in the non-linear material is modulated periodically to compensate for phase mismatching in the propagation constant of the alternating light waves. In frequency doubling, which is the most common and simplest non-linear process, KTP can bring about frequency doubling with type 2 phase-matching to wavelengths in the green area, but not much shorter. On the other hand, both blue light and UV radiation have been generated with quasi phase matching.

Quasi phase matching also gives higher efficiencies than type 2 phase-matching, by virtue of the possibility of using the largest non-linear coefficient, $d_{33}$, and also permitting alternation between all wavelengths within the transparent spectrum of the crystal by suitable selection of the period in non-linearity modulation. The majority of work on quasi phase matching has been carried out on waveguide structures where standard periodic domain inversion has been achieved with the aid of different diffusion methods combined with heat-treatment processes. These methods are well-suited for waveguides where domain inversion is in outer layers in which the waveguide is also located.

Waveguides are of particular interest in low power applications using diode lasers with which the light is concentrated to a small cross-sectional area of high power density. On the other hand, waveguides are not as suitable for high power applications, since the waveguide may be damaged thereby, due to the high power density among other things. In this latter case, frequency conversion in bulk crystals is normally used instead. This enables the light to be focused without reaching the damaging threshold and the high power can provide a high efficiency.

Quasi phase matching in bulk crystals can be achieved in crystals that have been poled (pole inversion, domain inversion) periodically in manufacture, or in crystals that have been poled subsequent to their growth. The latter is preferred, because a periodic pattern of much better quality can be obtained in this way.

In 1993, Yamada et al, U.S. Pat. No. 5,193,023, published the result of frequency doubling in LiNbO3 in crystals that had been poled periodically with a high voltage. The crystals were thin (<0.2 mm) and c-cut. Metal electrodes were deposited on the positive (c+) and the negative (c−) surfaces. The metal on the positive surface was periodically patterned by photolithographic methods and the second electrode was fully covering. The electrodes were connected to a high voltage pulse unit and poling was effected with pulses of 100 n's duration and a field strength of 24 kV/mm.

This method was later used by several producers and different ways of improving the method have been studied. In order to obtain a good periodic domain reversed pattern, it is necessary to effectively isolate those regions that are to be poled from those regions that are not. A photoresist, which is a good insulator, has been used to this end. This can be effected in at least two ways.

Firstly, periodic metal electrodes can be used and a photoresist deposited over these electrodes and the area therebetween. This avoids the occurrence of disturbing field lines between the electrodes, such field lines being liable to cause undesirable domain inversion and therewith impair the structure of the poling pattern.

Another way used for periodic domain inversion is to produce solely one periodic photoresist pattern and to contact the crystal electrically with liquid electrodes. This method, which was developed by Wedjörn, Electronic Letters, Vol. 30, page 894, 1994, is the most convenient method and gives good results.

Although period domain inversion has mainly been studied in LiNbO3, results of studies in Li7aO3 and KTP have recently been presented. Chen and Risk, "Chen, Risk, Periodic Poling of KTiOPO4 Using An Applied Electric Field, Electronic Letters, Vol. 30, 1516–1517 (1994)", poled 1 mm thick KTP periodically and showed effective frequency doubling to blue light with a poling technique similar to that used by Webjorn.

LiNbO3 is a material well suited for QPM. It has high non-linearity and is produced in large crystals of good uniform quality. It can provide components at a good price and is a reproducible manufacturing process. However, periodic domain inversion in LiNbO3 has some disadvantages in comparison with KTP. Firstly, it has been difficult to scale-up the poling technique in respect of thicker samples. Usable samples having a thickness of 0.5 mm have recently been produced, although KTP has been poled to a thinness of 1 mm already in the first publication.

The thickness of samples is highly significant in respect of frequency conversion with high power lasers and optical parametric oscillators. In the case of high power lasers, it may be desirable not to focus in the non-linear crystal at all. When the diameter of the laser beam may exceed 1 mm, a crystal having a thickness of several millimeters is desired so as to avoid edge-effect related problems. In the case of optical parametric oscillators (OPOs), it is important to be able to obtain a long length, and focusing through the crystal then results a beam diameter in the edge that can also exceed 1 mm.

OPOs are light sources that are pumped with light at angular frequency $\omega_1=2\pi c/\lambda$ and $\omega_2$ and $\omega_3$ are generated from noise. The energy condition is $\omega_1=\omega_1+\omega_2$ ($1/\lambda_1=1/\lambda_2+1/\lambda_3$). $\omega_1$ and $\omega_2$ are determined from the phase matching condition $k_1=k_2+k_3$, where $k=2\pi/\lambda$. $\lambda_2$ and $\lambda_3$ change when the refractive index n is changed, i.e. a tunable light source is obtained; see, for instance, Optical Electronics, A. Yariv, ISBN 0-03-070289-5.

As far as can be seen at present, it is not thought that it will be possible to pole LiNbO3 to the thicknesses necessary for these applications within the foreseeable future.

With respect to short wave frequency doubling to violet and UV, it is also unlikely that good poled crystals in LiNbO3will be produced successfully in the near future, although well in KTP.

When Chen and Risk poled KTP, they periodically used hydrothermally grown crystals. These crystals are normally characterized by a low ion conductivity, in the order of $10^{-6}$ S/cm. The most usual type of KTP is otherwise flux-grown crystals having an ion conductivity of $10^{-6}$ S/cm. These crystals are at present produced by many different crystal manufacturers the world over. Hydrothermally grown crystals, on the other hand, are commercially available from only one supplier. This supplier has periodically had serious problems in delivering crystals and demands a much higher price than that asked for flux crystals.

Other crystals in the KTP family grown by the flux technique are also available commercially. Although these different crystals are similar to one another, they all have slightly different properties, such as conductivity, transparent regions and non-linearity.

In studies carried out in accordance with the invention on the periodic poling of KTP and its isomorphs, it was found that conductivity is the property that most influences the quality of the final periodic structure. In order to achieve domain inversion, it is necessary to maintain across the crystal a field that exceeds the coercive field, until the ferroelectric domain is re-orientated. A high current will flow through a crystal of high conductivity when a high voltage is applied across the crystal.

Several problems have been encountered in the aforesaid studies, when attempting to pole flux-grown KTP periodically with the method described by Chen and Risk in respect of hydrothermal KTP.

It is difficult to maintain a sufficiently high voltage across the sample for domain inversion, because the current flowing through the crystal lowers the voltage. This is particularly true when the crystal has regions of slightly different conductivity. In this case, the voltage can be more than sufficient in some regions and insufficient in others.

A very high current through the crystal can also result in permanent damage. This damage can be both so-called electrochromic damage where the crystal loses in transparency and photoavalanche ionization leading to a breakthrough between the electrodes, and total destruction of the crystal.

It can be said in general that it is easier to pole crystals of low conductivity.

The scarcity of hydrothermal KTP and its high price demands the provision of a substitute. It has been shown that several isomorphs to KTP grown by the flux method have a lower conductivity than KTP. This applies to RTA, CTA and RTP, for instance. These crystals can be poled periodically much more easily than flux-grown KTP. A low mean energy can be delivered to the sample by current pulsing with short pulses and low repetition frequency (a low duty cycle), said pulse energy being sufficiently high to achieve domain inversion.

It has also been found that certain dopants which can be applied to KTP are able to lower the conductivity by several powers of ten. This applies to Ga and Sc, among others. These crystals become easier to pole. In this case, the dopant was added in the flux-smelt and therewith distributed relatively evenly in the crystal. One method of lowering the conductivity of a flux-grown KTP is to effect an ion exchange in the crystal. This method is the same as that used in the fabrication of waveguides. Conductivity can be lowered by one power of ten or more with an Rb exchange in KTP, which is sufficient to obtain a crystal that can be easily poled periodically.

There will now be described a method of preparation that will enable poling to be effected in flux-grown KTP periodically.

It has not earlier been possible to achieve controlled electric poling of flux-grown crystals of the optically nonlinear and ferroelectric material KTP. This is because the atomic lattice structure in KTP forms in the z-direction of the crystal channel-like structures in which ions (preferably $K_+$ ions) are highly mobile. The high and pronounced anisotropic ion conductivity that results here from minimizes the possibility of achieving across the crystal an electric potential that corresponds to the so-called coercive field required to provide domain inversion. Instead, the high current causes irreversible changes in the material that render the material useless for continued poling. Periodic poling of flux-grown KTP would otherwise be desirable, since these crystals can be grown with good homogeneity and at a low price in comparison with hydrothermal KTP.

The method is based on the creation of a layer of lower ionic conductivity at the crystal surfaces, by diffusion of another substance. One example of such a method is to bathe the KTP crystal in molten $RbNO_3$, which results in an ion exchange between $K^T$ and $RB_+$ so as to create a layer of $Rb_x K_{1-x} TiOPO_4$ at the surfaces of the crystal. When the ion exchange proceeds for a longer period of time, the concentration (x) of Rb at the surface will be 100% or close to 100%. The concentration then tails off in towards the depth of the crystal. The ion-exchanged layer has a much lower ionic conductivity than the bulk of the crystal. When an electric potential is then applied to the crystal, the greater part of the voltage will lie across the ion-exchanged region, as a result of voltage distribution.

A voltage corresponding to the coercive field can be achieved in the ion-exchanged regions at a given applied voltage, so as to obtain nucleation of an inverted domain, this inverted domain is then able to grow through the remainder of the crystal, under the influence of the residual electric field.

It should be mentioned here that ionic exchange with $RbNO_3$ together with $Ba(NO_3)_2$ has earlier been applied, W. Risk and S. Lau, "Chemical Patterning Technique for Periodic Poling of KTP Waveguides, in Nonlinear Guided Waves and Their Applications, Vol. 15, 1996, OSA Technical Digest Series (Optical Society of American, Washington, D.C., 1996)", pp.47–49, for periodic poling of KTP. Ion exchange with $Ba_{2+}$ increases the conductivity, since 2K+ is compensated for by one $Ba_{2+}$ ion and one vacancy. Ion conductivity increases greatly with increasing numbers of vacancies. However, there was used in this case hydrothermal KTP, which already has a sufficiently low ionic conductivity, and the ion exchange was effected periodically with the intention of counteracting domain inversion, thus in direct contradistinction to what has been described above. Examples as to how an ion exchange can be implemented in flux-grown crystals will now be given.

A c-cut disc of flux-grown KTP crystal that cannot be poled with known techniques was subjected to an ion exchange process in $RbNO_3$ at 350° C. for six hours. The crystal was not patterned and the ion exchange took place on both sides of the disc. Conductivity, measured transversely of the disc in the direction of the c-axis, was found to decrease. The extent of this decrease differed in accordance with the quality of the crystal, but typically by one or more powers of ten. The piezoelectric signal increases with the ion exchange, said signal being used most often to probe the domain patterns of the crystals. Poling was effected by applying a periodic electrode pattern on one of the two c-surfaces (c+ or c−). The electrode may be a metallic electrode or a liquid electrode and the insulation a photoresist. The crystal was poled by applying electric voltage pulses, normally of 60 ms duration. An electric-optic measuring method was used to determine when poling took place. Pulses having successively increasing voltages were used, and when poling commenced the same or a slightly higher voltage was used for the following pulses until poling was complete.

In certain experiments on-line frequency doubling may also be used as a monitoring method, e.g. in respect of crystals patterned for frequency doubling of Nd: YAG lasers. Experiments also indicate that higher quality poling is achieved than that achieved when poling hydrothermally grown KTP. This may be because the crystals obtain a more uniform conductivity subsequent to the ion exchange and therefore pole more homogeneously at a given voltage. Conductivity often varies significantly across the crystal surface in respect of hydrothermally grown KTP, and also in respect of flux-grown crystals.

With the intention of effecting an ion exchange on only one side of the disc, the same experiment was applied although in this case one side of the disc was coated with metal prior to the ion exchange, this exchange again being effected the $RbNO_3$. Either the c+ side or the c side may be used for the ion exchange in this case. The ion-exchanged side is then patterned periodically with metal or with a phororesist pattern, and poling is then effected in the same way as that described above. The optical results are equivalent to the results of the above example.

A periodic metal mask coated on c+ side or c− side was used for a periodic ion exchange. The mask may be comprised of titanium for instance, and produced by photolithography with lift-off. RbNO3 in a concentration of 100% was used for the ion exchange, to lower the conductivity in the ion-exchanged region and to obtain a potable crystal. The rear side was blocked with a fully covering electrode during the ion exchange. The metal mask was removed after the ion exchange. This can be achieved with a short HF etching, in an EDTA etching or some other metal etching. The crystal is poled with a fully covering electrode, metal or liquid, i.e. no periodic electrode is used. The periodically ion exchanged region can now be domain inverted while the remaining regions remain uninvested. The optical results were equivalent to the above results.

A flux-grown KTP crystal was subjected to ion exchange in accordance with the first two experiments above. The crystal was then patterned periodically with a metal mask, e.g. a titanium mask, on one side. The other side was blocked with a fully covering metal mask. The crystal was then subjected to an ion exchange in a mixture of 5% Ba(NO3)2 and 95% RbNO3 over a period of one hour and at a temperature of 350° C. The masks were then removed and the crystal poled with a fully covering electrode. Pole inversion then takes place solely in those regions not subjected to an ion exchange in the second bath with Ba(NO3)2. This is because the BA2+ ion that migrates into the crystal in the ion exchange is divalent and followed by a vacancy, at the same time as row monovalent K-ions diffuse out of the smelt. The vacancies in this region result in higher ion conductivity and thus prevent pole inversion from taking place. The first ion exchange causes the conductivity to decrease across the whole of the crystal, thereby enabling the crystal to be poled. The second ion exchange causes conductivity to increase locally, whereby poling cannot take place in these regions.

The optical results of the experiment were also equivalent to the results of earlier experiments.

The ion exchange results in a composition gradient in the crystal surface. This composition gradient is also accompanied by strong internal mechanical stress. After the ion exchange, the diffusion profile can be removed and the stress in the crystal reduced by heat-treating the crystal subsequent to the periodic poling. Removal of the diffusion profile and stress reduction can be effected over a period of time ranging from some minutes to several hours at a temperature of from 300 to 500° C. or higher.

In the majority of the examined crystals produced in accordance with the experiment, there was obtained with respect to frequency doubling an efficiency that corresponds to an effective non-linearity, d33, better than 50% of the theoretical optimal. An effective length can be calculated from the spectral bandwidth. This length is also greater than 50% of the actual physical length.

The preparation of non-low conductive flux-grown crystals is necessary in order ro enable such crystals to be poled by means of the inventive method and arrangement, and also by means of other poling methods and apparatus. As before mentioned, this has not been achievable in a satisfactory manner with the aid of known methods and arrangements.

In materials of very low conductivity such as hydrothermal KTP, LiNBO3 and LiTaO3, poling can be monitored actively so that the periodic structure becomes optimal by virtue of following the current flowing through the crystal in the poling process. As will be seen from FIG. 1, the current has row contributions. The first I1 of these contributions corresponds to the impedance constituted by the crystal in the outer circuit from the voltage unit. The second contribution I2 corresponds to the charge transfer that takes place during poling of the crystal. A certain amount of energy is required to invent the ferro-electric domain, this energy corresponding to an applied charge $Q=2P_sA$, wherein $P_s$ is the spontaneous polarization of the material and A is the inverted area. Typical examples are I1 in the uA range for hydrothermally grown ITP and in the mA range for flux-grown ITP, I2 is normally uA.

FIG. 1 illustrates a circuit for poling low conductive crystals, said circuit comprising a voltage unit 10 which generates voltage pulses, an ampere meter 12 for registering the current rate $I=I_1+I_2=U/(R_1+R_2)$, where U is the rate of the voltage drop across the impedances $R_1$ and $R_2$, wherein $R_2$ constitutes the impendence of the crystal 14.

It is possible to separate the conductive contribution from the poling contribution to the current for a crystal of low conductivity ($10^{-9}$ S/mm), for instance a hydrothermally grown KTP crystal, by measuring the current that enters the crystal when a voltage pulse is applied. In a high conductive crystal, such as ion-exchanged flux-grown KTP, for instance the conductive current conceals the poling current.

Thus, when poling crystals of sufficiently low conductivity, current measuring processes can be applied to select the proper poling dosage whereas the method cannot be used with crystals that have a high conductivity.

In the case of the present invention, there has been developed a method of periodically poling ferroelectric crystals which can be applied with the use of the more highly conductive flux-grown crystals from the KTP family. In respect of these crystals, there is applied a poling process monitoring method based on the electro-optical effect of the crystal. This method can also be applied to crystals of low conductivity, of course.

Figure 2:
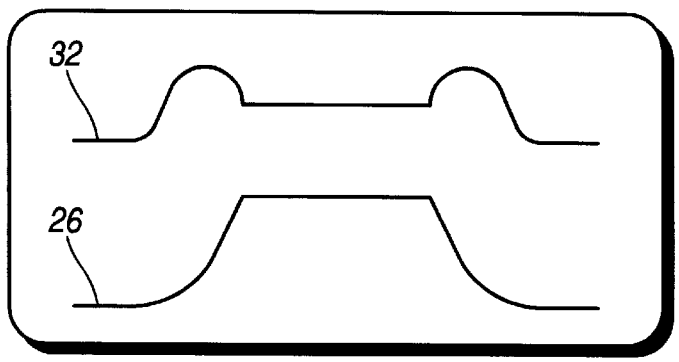
FIG. 2 illustrates schematically an arrangement of apparatus for monitoring poling of flux-grown crystals in accordance with one embodiment of the present invention.
Figure 2:
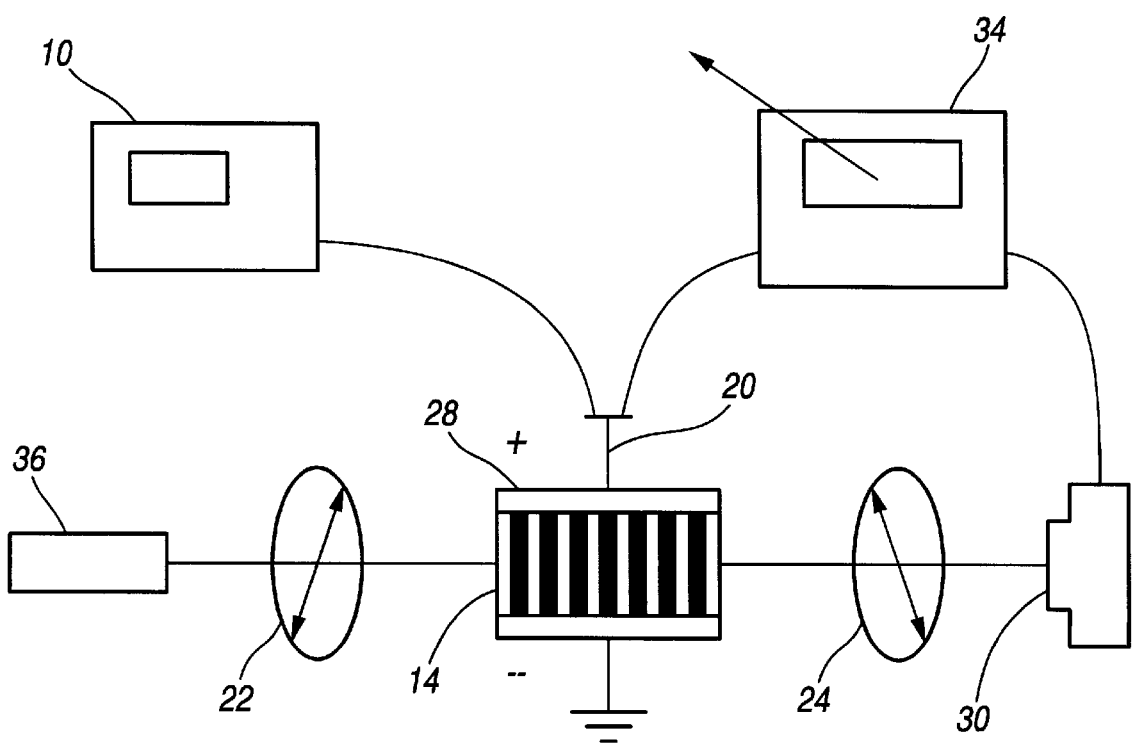

In one embodiment of the method, there is used the transversal electro-optical effect, meaning that an electrical field applied across the crystal in the z-direction 20 initiates a phase shift between different polarization directions of light that propagates through the crystal at right angles to the z-axis. In a test set-up, the beam propagates from an He—Ne laser 36, which is linearly polarized at 45° 22 between the y and z axes, along the x-axis of the crystal; see FIG. 2.

The phase shift between the y and z components of the light, said shift being dependent on the electro-optical coefficients in the crystal and on the applied electric field, changes the polarization state of the light. For instance, in the case of a successively increasing phase shift from 0-radians to π-radians, the polarization changes from a linearly polarized state, via circular polarization and different types of elliptical polarization, to a linearly polarized state at right angles to the original state. Voltage pulses 26 are applied across the crystal during poling, wherein a periodic electrode 28 is defined photolithographically on one side of the crystal.

The poling process is monitored by studying the polarization state of the light that has passed through the crystal while the voltage pulse is applied. This is effected by measuring with the aid of a photodiode 30, the intensity 32 of the light that passes through an analyzer 24 positioned at 45° between the y and the z axes downstream of the crystal. The output signal of the photodiode 30 is taken into an oscilloscope 34 and can be studied simultaneously with the voltage pulse 26 generated by the voltage unit 10. In an unequivocal poled state, the intensity 32 (at a linearly rising voltage) will follow a sinusoidal curve (not shown) until its maximum voltage is reached, wherein the intensity remains at a constant level and then follows the same curve back as the voltage decreases.

The intensity curve 32 will change as the crystal 14 is poled, since domain inversion of one region will cause the electro-optical coefficient in this region to change sign. When a periodic structure has finally been poled with the domain inverted area equal to the non-domain inverted area (50% duty cycle), the continued change of the total electro-optical coefficient that the light experiences during its propagation through the crystal will be much smaller, since any domain propagation is a much slower process than the actual poling process.

Consequently, the intensity curve will be almost a straight line, indicating that it is time to terminate the poling process (marked by the black and the white domains in the crystal 14).

Because the crystal is normally also double-refractive, which also influences the polarization state, it is difficult to forecast where on the sinusoidal curve the intensity is located prior to applying the voltage. This is not important, however, since the end goal is to obtain a straight line, wherein the intensity curve can be readily followed backwards during the course of the poling process.

Figure 3:
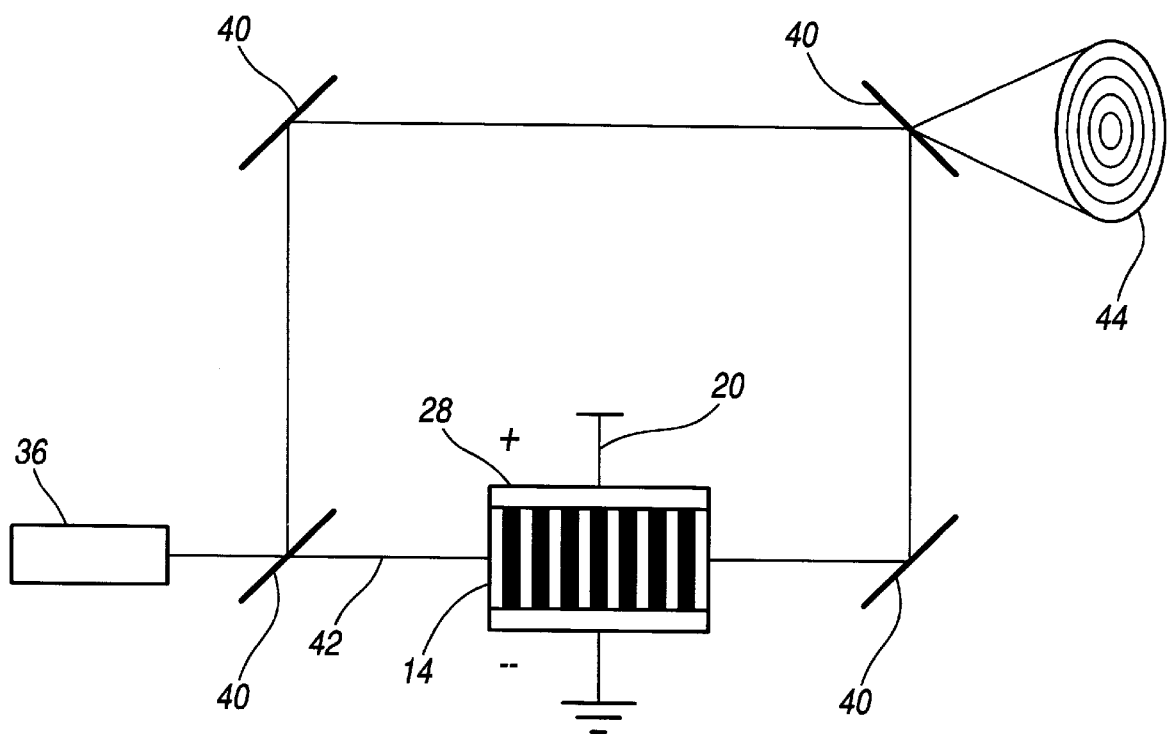
FIG. 3 is a schematic illustration that shows how a Mach-Zehnder interferometer is used to monitor the poling process in accordance with another embodiment of the invention.

In an alternative embodiment of the aforesaid method, see FIG. 3, in which the transversal electro-optical effect is also used, the beam 38 from the He—Ne laser 36 is divided for entering into a Mach-Zehnder interferometer 40.

The beam 38 is permitted to pass through the crystal in one of the arms 42 and an electric field is applied across the crystal in the z direction 20. When the phase of the light passing through the crystal is influenced by the electro-optical effect, the interference rings 44 at the interferometer output will move either inwardly or outwardly as the voltage across the sample 14 changes. Similar to the previous embodiment, the poling process will change the total electro-optical effect across the crystal 14. When movement of the interference ring 44 begins to change direction, this can be taken as an indication that it is time to terminate the poling process.

In one embodiment of the invention, the voltage generating electrodes may be periodic so-called finger electrodes, wherein the insulation between the electrode fingers may be air, some other gas, a liquid, glass, a polymer or a vacuum.

Although the present invention has been described with reference to specific embodiments thereof, it will be evident to the person skilled in this art that other embodiments are feasible within the scope of the following claims.

We claim:

1. A method of periodically inverting the domain of a ferroelectric flux-grown crystal comprising the steps of:

lowering the conductivity of said crystal; and then effecting domain inversion.

2. A method according to claim 1, wherein said step of lowering the conductivity comprises the step of doping said flux-grown crystal with a dopant or dopants.

3. A method according to claim 2, wherein said dopant or dopants are selected from the group consisting of Ga, Sc, Cr and Rb.

4. A method according to claim 1, wherein said step of lowering the conductivity comprises the step of creating a layer of lower ionic conductivity at the crystal surfaces by ion exchange; and wherein said step of effecting domain inversion comprises the steps of applying an electric voltage via voltage division across said layer, and creating a domain which grows through the whole of the crystal under the influence of an electric field.

5. A method according to claim 1, wherein said step of effecting domain inversion includes providing period electrodes applied on one side of the crystal.

6. A method according to claim 5, wherein said electrodes are liquid electrodes or metal electrodes, and further including insulation between said period electrodes selected from one of air, gas, a liquid, glass, a polymer and a vacuum.

7. The method of claim 1 wherein said ferroelectric flux-grown crystal is selected from the group consisting of KTP, KTA, RTP, RTA, and CTA.

8. The method of claim 1 wherein said step of lowering the conductivity comprises ion exchange on at least one surface.

9. A method according to claim 8, wherein said ion exchange is effected solely on one side of the crystal.

10. A method according to claim 8, wherein ion exchange is effected periodically, to obtain a crystal having spatially varying conductivity.

11. A method according to claim 10, wherein said domain inversion is effected solely in the region of low conductivity.

12. A method according to claim 8, wherein said ion exchange is effected across the whole surface of the crystal so as to lower conductivity; and further comprising the step of effecting a second ion exchange so as to again periodically increase the conductivity.

13. A method according to claim 12, wherein said step of effecting domain inversion is by applying electric pulses having a voltage such that solely the regions of low conductivity will be domain inverted.

14. A method according to claim 8, wherein said step of effecting said ion exchange is with one or more of the ions selected from the group consisting of Rb, Ba, Na, Cs, H, Li, Ca and Sr.

15. A method according to claim 8, wherein said step of effecting said ion exchange is with nitrate salts.

16. Apparatus for monitoring the periodic domain inversion of a ferroelectric crystal by using the electro-optic effect of the crystal, said apparatus comprising means for generating light to propagate through the crystal at right angles to the z-axis of the crystal, means for applying an electric field across the two poles of the crystal in the z-direction, one of said two poles having a periodic electrode structure, thereby causing a phase shift between different polarization directions of light that propagates at right angles to said z-axis, said phase shift between the z-component of the light and any of its remaining components changing the polarization state of the light in dependence on the electro-optical coefficients of the crystal and the applied electric field, and means for receiving said phase-shifted light to determine the resulting domain inversion by observing changes caused by voltage pulse generating means via the electric field.

17. The apparatus according to claim 16, wherein said light is generated by a laser.

18. The apparatus according to claim 16, wherein said means for receiving phase-shifted light is a photodiode that measures the intensity of received light, and further including means for analyzing the output signal from the photodiode; and means for comparing said analyzed output signal with the applied voltage pulse, to determine domain inversion by comparing the shape of the intensity curve from pulse to pulse with the use of short voltage pulses, and to determine when the domain inversion is optimally terminated by changes in the voltage pulses.

19. The apparatus according to claim 16, wherein the crystal that phase shifts the light and the means for receiving phase-shifted light are included in an interferometer, and wherein domain inversion is terminated when the interference rings generated by the interferometer change direction.

20. A method of manufacturing an optical crystal having periodically inverted domains comprising the steps of:

lowering the conductivity on at least one surface of two opposing surfaces of a ferroelectric flux-grown crystal by doping or ion exchange;

contacting substantially the full surface of one of said two opposing surfaces with a first electrode and periodically contacting the other one of said two opposing surfaces with a second electrode; and applying a voltage across said first and second electrodes to effect said periodically inverted domains.

* * * * *